United States Patent [19]
Jett et al.

[11] Patent Number: 6,008,664
[45] Date of Patent: Dec. 28, 1999

[54] PARAMETRIC TEST SYSTEM AND METHOD

[75] Inventors: Allen Jett; Archer R. Lawrence, both of Austin, Tex.

[73] Assignee: Tanisys Technology, Inc., Austin, Tex.

[21] Appl. No.: 09/033,285

[22] Filed: Mar. 2, 1998

[51] Int. Cl.⁶ .............................. G01R 31/02; G01R 31/26
[52] U.S. Cl. ........................................... 324/765; 324/763
[58] Field of Search ................................. 324/763, 765, 324/158.1

[56] References Cited

U.S. PATENT DOCUMENTS

| | | | |
|---|---|---|---|
| 4,092,589 | 5/1978 | Chau et al. .............................. | 714/736 |
| 5,223,792 | 6/1993 | El-Ayat et al. .......................... | 324/765 |
| 5,539,694 | 7/1996 | Rouy ..................................... | 365/189.09 |
| 5,745,405 | 4/1998 | Chen et al. ............................. | 365/154 |

*Primary Examiner*—Josie Ballato
*Assistant Examiner*—Russell M. Kobert
*Attorney, Agent, or Firm*—Baker & Botts, L.L.P.

[57] ABSTRACT

A system and method for reducing voltage stabilization time in a leakage current test system, and thereby reducing the time for measuring leakage currents in the I/O pins of an IC chip including CMOS DRAMs is disclosed. The method and system of the present invention accelerates leakage current testing time by precharging the capacitance of the I/O pins under test to a voltage near the settled voltage level, before measuring leakage current at the I/O pin contact points of packaged IC chips and assembled IC modules, and indicating when an I/O pin is defective.

8 Claims, 1 Drawing Sheet

PARAMETRIC TEST SYSTEM AND METHOD

RELATED APPLICATIONS

This application is related to three U.S. Patent applications entitled "Tester Systems," application Ser. No. 09/033,364, now pending; "Contact Test Method And System For Memory Testers,"application Ser. No. 09/032,958, now pending; and "Programmable Pulse Generator," application Ser. No. 09/032,968, now pending; assigned to the assignee of the present invention and filed on even date herewith.

FIELD OF THE INVENTION

The invention relates generally to semiconductor test systems, and more particularly to a circuit for reducing the time for stabilizing the voltage across a current sensing resistor to accommodate an accurate measurement of leakage current in the I/O pins of packaged, commercial grade IC chips.

BACKGROUND OF THE INVENTION

One of the parameters which is tested to determine whether an IC chip is defective is I/O pin leakage current. A drawback in testing for leakage current has been the excessive test time that has been required. As illustrated by the prior art circuit of FIG. 1, test methods in common use apply a voltage through a large current sensing resistor to the pin under test, and measure any current which results therefrom by knowing the value of the resistance provided by the resistor, and determining the voltage across the resistor. Tests are conducted for both high voltage and low voltage leakage. Thus, when testing for high voltage leakage, a high voltage is applied to the pin under test, and all other I/O pins of the IC chip are forced to a low voltage. In contrast, when a low voltage leakage test is conducted, a low voltage is applied to the pin under test, and all other pins are forced to a high voltage level. The pin under test, therefore, is always at a voltage different from that of the other pins. As a result, a time equal to the settling time of the pin under test must occur before either an accurate measurement of the leakage current at the pin may be made, or a determination may be made as to whether the pin is operating within acceptable tolerances. Settling time is a function of desired accuracy, and the R-C time constant is determined by the resistance of the test sensor resistor, and the sum of the capacitance of the test fixture and the I/O pin under test. Thus, for a given R-C time constant, when the test voltage is applied, voltage across the test sensor resistor follows a known exponential curve with respect to time. Further, the voltage is asymptotic to a final value, and takes time to reach the final value and settle before accurate measurements may be made.

Referring to the prior art circuit of FIG. 1, a precision D/A voltage source 10 is shown, the output of which is electrically connected to the input of a unity gain buffer amplifier 11. The output of the amplifier 11 in turn is electrically connected to one terminal of a precision high resistance current sensing resistor 12, and to the positive input of an instrumentation amplifier 13 which is used to monitor the performance of an I/O pin of an IC chip such as, by way of example, a CMOS dynamic random access memory (DRAM). The other terminal of the resistor 12 is electrically connected to the pole input of a single pole, single throw switch, and to the negative input of the amplifier 13. The output of the amplifier 13 is electrically connected to the input of an AID converter 15, the output of which is electrically connected to the input of a processor 16 that is used to calculate the leakage current of the memory module pin under test. The output of the switch 14 is electrically connected to one terminal of a test fixture capacitance 21, and to an I/O pin 22 of the unit under test (UUT). The other terminal of capacitance 21 is electrically connected to ground. The I/O pin 22 is represented by an I/O pin capacitance 23 and a source of leakage current 24 which are electrically connected in parallel to ground.

In operation, all I/O pins of a memory module except the pin under test are forced to either a high or a low voltage. The pin under test is forced to a voltage at the opposite end of the voltage range from that of the other pins. For CMOS DRAMs, by way of example, a high voltage for test purposes would be of the order of 5.0 volts, and a low voltage would be of the order of 0.0 volts. Assuming that all pins of a memory module except a pin under test are at 5.0 volts, the voltage source 10 would apply 0.0 volts through sense resistor 12 to switch 14. Upon the switch 14 being closed, a voltage would be applied to the pin under test. A delay time thereupon would have to occur to allow the test fixture capacitance 21 and the I/O pin capacitance 23 to discharge, and to allow the voltage across the current sensing resistor 12 to settle. Thereafter, A/D converter 15 would digitize the voltage received from instrumentation amplifier 13. The processor 16 would normalize the digitized value received from the A/D converter 15 as necessary, and divide the digitized value by the known resistance of the current sensing resistor 12 to provide an accurate measurement of the leakage current in the pin under test. The processor 16 then would indicate to the user whether the pin under test was within acceptable operating tolerances.

The settling time for the voltage applied across current sensing resistor 12 to a pin under test is the primary cause of excessive test times in measuring DC leakage currents. With CMOS devices, the leakage current is very small. That is, of the order of 100 nanoamps. Current sensing resistors having high resistance, therefore, are required to achieve measurable resolutions. With current sensing resistors having a resistance of the order of one megaohm and higher, the charge and discharge times of the I/O pins are high. The number of processor sample cycles which are required before an accurate measurement can be made, therefore, is high. Each of these factors contribute to the time required to conduct leakage current tests.

Prior art systems include that disclosed in U.S. Pat. No. 5,696,773 issued to Miller, which describes an apparatus used for performing leakage current tests on digital logic circuits. A parametric signal source employs two precision 1 MΩ current-sensing resistors per pin under test one for positive leakage currents and one for negative leakage currents. Each of the resistors is electrically connected in series with a D/A converter. The parametric signal source applies positive and negative parametric signals through Schottky diodes in series to a pin under test. Leakage currents are determined by dividing a voltage value at the positive and negative D/A converter outputs by the value of respective positive and negative current sensing resistors. The leakage currents then are compared with threshold leakage currents to determine acceptability. This system sources a voltage through a current-sensing resistor to the pin under test, and is subject to a pre-measurement settling time imposed by an R-C time constant.

U.S. Pat. No. 3,976,940 to Chau describes a testing circuit for providing digital stimuli to and receiving digital responses from I/O pins of a device under test at speeds up to 10 MHz. A pair of comparators for comparing the digital responses with minimum thresholds, and a multiplexer selecting between comparator outputs, allow continuous operation of the comparator and accommodates certain digital testing at high speeds up to 10 MHz. However, leakage testing is not conducted at such speeds. The circuit requires a plurality of FET transistors in parallel to achieve a low electronic switch "ON" resistance, and uses electromechanical relays which require at least 5 milliseconds to settle. Further, ECL technology is used which exhibits high power consumption at any given speed.

U.S. Pat. No. 3,702,967 to McPhail discloses a unipolar electronic test system for semiconductor devices that is operable in either current or voltage sourcing modes to sense leakage current flowing through a measurement resistor. This system sources a voltage through a current-sensing resistor to the pin under test, and is subject to a pre-measurement settling time imposed by an R-C time constant.

U.S. Pat. No. 4,004,222 to Gebhard discloses a test system for semiconductor SRAM cells. The detection of failed memory cells caused by inoperative memory cell pull-up elements, however, may be masked when normal stray capacitance on the nodes of the memory cell cannot be charged or discharged in an acceptable amount of time while a pattern test is being conducted. Methods are proposed to increase memory cell leakage during test by increasing photocurrent through illumination, and by elevating device temperature by as much as 80° C. to quicken stray capacitance discharge time and shorten overall test time. However, the Gebhard system is not useable with commercial grade ICs, which are packaged and not rated for elevated temperatures.

U.S. Pat. No. 4,542,340 to Chakravarti discloses a method of measuring leakage currents in FET (field-effect transistor) semiconductor memory arrays using test sites formed in the kerf or cut regions of a wafer to test for acceptable leakage currents before sawing the wafer into chips to be packaged. The test points used in the Chakravarti method and system are not available after chips are cut from the wafer or packaged.

U.S. Pat. No. 4,595,875 to Chan et. al. discloses a leakage current and pin short detector for bipolar PROMs based on the inclusion of fault detection circuitry incorporated into the memory device. By applying a selected positive voltage to a test node, and measuring the resulting current into the node, deviations from a characteristic current-voltage (I-V) curve are observed to detect faulty devices. The Chan test circuit tests for leakage currents in memory cells, and not for I/O pin leakage currents as with the present invention.

U.S. Pat. No. 4,685,086 to Tran discloses an SRAM cell leakage detection circuit that is built into the memory chip itself. The tests which are conducted are based upon the principle of sensing complementary logic levels from properly operating SRAM cells (by way of example "01" or "10"), and by using a simple 2-input gate with appropriate thresholds to sense the absence of complimentary logic levels in defective cells. The Tran circuit is used only for memory cell testing, and not for I/O pin testing as with the present invention. Further, the Tran is not available for testing after a chip is packaged.

U.S. Pat. No. 4,800,332 to Hutchins discloses a reconfigurable IC with a capability to test for memory cell leakage. A test voltage is connected to a particular node of a memory device, while the rest of the memory device remains at a normal operating voltage. The test voltage is modulated to determine the voltage at which stored charge begins to leak between memory cells. Tests occur during memory device manufacture, and once the tests are concluded, the memory device is reconfigured for normal operation. Hutchins conducts only memory cell tests, and does not perform I/O pin tests as with the present invention. Further, the Hutchins test system is not available after a chip is packaged.

U.S. Pat. Nos. 4,841,482 and 4,860,261 to Kreifels et. al. disclose a circuit and method for leakage verification for flash EPROM/EEPROM memory cells. The circuit switches from a logic zero voltage to a non-zero test voltage on the word select lines of a memory cell, thereby enabling a measurement of leakage current on the bit lines of all cells coupled to the bit lines. The Kreifels' system and method test memory cells only, and not contact points outside a memory cell as does the present invention.

U.S. Pat. No. 5,132,929 to Ochii discloses an enhancement to an SRAM which allows leakage current measurements to occur in a test mode when the common $V_{SS}$ terminal of a memory cell flip-flop is brought to the $V_{DD}$ potential. A current sensing resistor is switched between the bit lines and the $V_{DD}$ potential, and a voltage reflecting leakage current is measured from one terminal of the current sensing resistor. Again, memory cell rather than I/O pin testing occurs, and the Ochii test terminals are not available after a chip is packaged.

U.S. Pat. No. 5,351,214 to Rouy discloses a circuit for the detection of bit line leakage by employing an output comparator having one input switchable between normal operation and a leakage reference in test mode, and a second input receiving the output of a memory array. When the leakage current threshold is selected during test mode, all word lines are simultaneously deselected, thus allowing only leakage currents on memory bit lines. The Rouy circuit only tests memory cells, and not I/O pins as does the present invention.

U.S. Pat. No. 5,491,665 to Sachdev discloses electronic circuitry fitted to an array of memory cells, whereby in a test mode all cells are accessed in parallel so that an $I_{DDQ}$ test may discover whether there is a defect in any of the cells. The Sachdev circuit tests memory cells only, and not I/O pins.

U.S. Pat. No. 5,659,511 to Huang discloses a method for measuring the leakage current of a DRAM capacitive junction by defining a large test memory cell comprised of numerous memory cells, and calculating the leakage current density of the large test memory cell by dividing the contact area of the bottom plate of the capacitor of the memory test cell, into the difference in junction leakage current between the memory cell transistor on and off states. The leakage current density of the memory test cell is taken as representative of the individual memory cells.

In contrast to the above prior art, the present invention conducts I/O pin leakage measurements after the IC chips are packaged, and assembled into IC modules. Further, the process of leakage current testing is accelerated by precharging the capacitance of the I/O pin under test to a voltage near its settled voltage, thereby reducing overall test time. More particularly, the present invention: 1) may switch either a ground potential or a selected voltage in electrical series with a low value resistor to the pin under test for rapid discharge and precharge of pin capacitance, thus shortening overall measurement time; 2) requires only one D/A converter as a voltage source for a single precision current-sensing resistor; and 3) identifies acceptable leakage current comparisons, and provides actual leakage current measurements which are suitable for manufacturing process monitoring. In addition, the present invention obviates the need for measurement corrections due to variations in temperature coefficients of diodes in series with the pin under test, and employs electronic switches having switch times less than one microsecond. Still further, the present invention is fully bipolar with respect to the polarity of voltage sourced and the direction of current measured through adaptation of operational amplifier technology. In addition, the present invention exhibits an economy of electronic components for increased reliability.

SUMMARY OF THE INVENTION

In accordance with the invention, the method and system of the present invention accelerates leakage current testing time by precharging the capacitance of the I/O pins under test to a voltage near the settled voltage level, before measuring leakage current at the I/O pin contact points of packaged IC chips and assembled IC modules, and indicating when an I/O pin is defective.

A precision voltage source is applied through a buffer amplifier to the positive input of an instrumentation amplifier, and to a switch array comprised of a plurality of current sensing resistors electrically connected in parallel. Each of the current sensing resistors in turn is electrically connected in series to a pole of one of a plurality of single pole, single throw range selecting switches having output terminals connected in parallel. The output terminal of each of the range selecting switches also is connected to the negative input of the instrumentation amplifier and to the pole of a test control switch, the output terminal of which is connected in electrical series with an I/O pin of an I/C chip under test. A pair of high side stabilizing resistors, each having a resistance small compared to that of any one of the current sensing resistors, are connected in electrical series to ground and to the output of the buffer amplifier. A high side stabilizing switch has a pole electrically connected between the high side stabilizing resistors, and an output terminal electrically connected to the output terminal of the test control switch. A low side stabilizing resistor has one terminal electrically connected to ground, and the other terminal electrically connect to the pole of a single pole, single throw low side stabilizing switch. The output terminal of the low side stabilizing switch is electrically connected to the output terminal of the test control switch, the output terminal of the high side stabilizing switch, and to the I/O pin of the IC chip under test. The output of the instrumentation amplifier is applied through an A/D converter to a processor for calculating a leakage current value, and comparing the leakage current value to a threshold value to determine whether the leakage current is within tolerance.

Before a leakage current measurement is taken, all switches are open. Thereafter, one of a plurality of leakage current ranges is selected within which a current limit for the IC chip under tests lies. The selected leakage current range corresponds to one of the current sensing resistors. The range selecting switch for the particular current sensing resistor so identified is closed while the remaining range selecting switches are held open. Thereafter, either a high voltage or a low voltage test is conducted. For the high voltage test, the high side stabilizing switch and the test control switch are closed. After approximately ten microseconds, the high side stabilizing switch is opened. Thereafter, the processor normalizes the output of the A/D converter, and compares the normalized value with a threshold value to determine whether the I/O pin is within tolerance.

If a low voltage test is conducted, the low side stabilizing switch rather than the high side stabilizing switch is closed in the above process. Otherwise, the test steps are the same.

In an alternative embodiment, a comparator having as one input a precision reference voltage supplied by a second precision voltage source, and as the other input the output of the instrumentation amplifier, is used to indicate when an I/O pin of an IC chip is within leakage current tolerances. More particularly, the second reference voltage is set to provide the maximum allowable leakage current for the current sensing resistor being used. If the comparator output is a logic zero, the I/O pin under test is within tolerances. Otherwise, the I/O pin is out of tolerance.

In one aspect of the invention, the test circuit is fully bipolar with respect to the voltage sourced, and the direction of current measured.

In another aspect of the invention, low power components are used which when coupled with an economy of parts provides increased reliability.

In still another aspect of the invention, actual leakage current measurements are provided which are suitable for manufacturing process monitoring.

BRIEF DESCRIPTION OF THE DRAWINGS

The accompanying drawings, which are incorporated in and constitute a part of the specification, illustrate preferred embodiments of the invention, and together with the general description given above and the detailed description of preferred embodiments given below serve to explain the principles of the invention.

DESCRIPTION OF PREFERRED EMBODIMENTS

In the descriptions which follow, like reference numbers refer to like devices.

Figure 2:
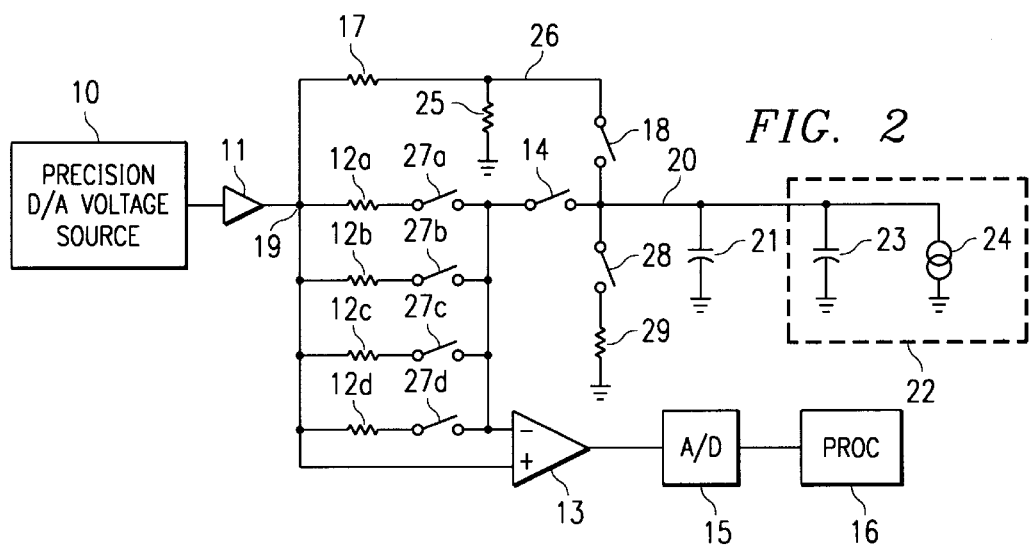
FIG. 2 is an improved electronic test circuit, in accordance with the invention, which reduces the test time for measuring the DC leakage currents of the I/O pins of the IC chip.

An improved leakage current testing circuit, in accordance with the invention, for testing I/O pins in commercial grade, packaged IC chips which also may be assembled into memory modules, is illustrated in FIG. 2.

The precept for designing the circuit of FIG. 2 may be represented mathematically as follows:

Assuming the following term definitions and conditions:

| | |
|---|---|
| initial I/O pin voltage | $V_0 = 5.0$ V; |
| sense resistor resistance | $r_s = 2.00$ MΩ; |
| test fixture capacitance | $C_F = 800$ pF; |
| I/O pin capacitance | $C_D = 200$ pF; and |
| stabilized capacitive current | $I_s = 10$ nA; |
| time | t; |
| voltage at a given time t | $V_t$; |
| current at a given time t | $I_t$; |
| time required for stabilizing | $t_s$; |

$$V_t = V_0 \cdot e^{-t/r_s \cdot (C_F + C_D)} \quad (1)$$

or $$I_t = [V_0 \cdot e^{-t/r_s \cdot (C_F + C_D)}]/r_s \quad (2)$$

If we solve for the time t when current arising from total capacitance of $C_F$ and $C_D$ reaches 10 nA (nanoamperes) stabilizes, $$t_s = -r_s \cdot (C_F + C_D) \cdot \ln[(I_s - r_s)/V_0] \quad (3)$$

$$t_s = -2 \times 10^6 \cdot (800 \times 10^{-12} + 200 \times 10^{-12}) \cdot \ln[(10 \times 10^{-9} \cdot 2 \times 10^6)/5.0] \quad (4)$$

$$t_s \approx 11 \text{ ms} \quad (5)$$

If we temporarily reduce $r_s$ using a stabilizing resistor of approximately 400 Ω, then we calculate:

$$t_s \approx 5.6 \text{ }\mu s$$

Thus, it can be seen that the value for $t_s$ with a 400 Ω stabilizing resistor is approximately 1/2000 of the value for $t_s$ without a stabilizing resistor.

Figure 1:
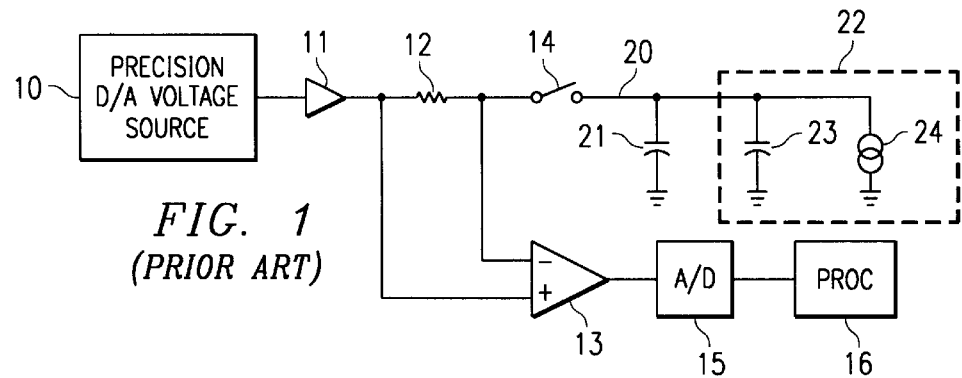
FIG. 1 is a prior art electronic circuit which is commonly used in measuring DC leakage currents of the I/O pins of IC chips including dynamic random access memories or DRAMs.

Returning to FIG. 2, the devices referred to by reference numbers 10–11, 13–16, and 20–24 are as before described. Current sensing resistor 12 of FIG. 1 is replaced in FIG. 2 by a bank of four current sensing resistors 12a, 12b, 12c, and 12d, one terminal of each of which is electrically connected to the output of buffer amplifier 11. The other terminals of current sensing resistors 12a–12d are electrically connected, respectively, to an input pole of single pole, single throw range selection switches 27a–27d. The output terminals of switches 27a–27d are electrically connected to the negative terminal of instrumentation amplifier 13, and to the input pole of a single pole, single throw test control switch 14. The output pole of switch 14 is in electrical connection with a line 20 leading to the I/O pin 22 of an IC chip under test.

In the preferred embodiment, the precision D/A voltage source 10 which may be identified by part number AD669BR, the buffer amplifier 11 which may be identified by part number OP-249, the instrumentation amplifier 13 which may be identified by part number AD620BR, and the A/D converter 15 which may be identified by part number AD976, are all commercially available from Analog Devices, One Technology Way, P.O. Box 9106, Norwood, Mass. 02062-9106; switches 14, 18, 27a–27d, and 28 are electronic programmable switches which are commercially available from Temic Semiconductor of 2201 Laurelwood Road, Santa Clara, Calif. 95054, as part number DG411DY. Current sensing resistors 12a–12d have resistances as stated in Table I below, all with a tolerance of 0.1%.

A high-side stabilizing circuit comprised of high side stabilizing resistors 17 and 25, and a high side stabilizing switch 18 is electrically connected between the output of the buffer amplifier 11 and the line 20. The high side stabilizing circuit has an effective resistance small compared that of any of the current sensing resistors 12a–12d. More particularly, a high side stabilizing resistor 17 has one terminal electrically connected to the output of amplifier 11, and the other terminal electrically connected to one terminal of a high side stabilizing resistor 25. The other terminal of resistor 25 is electrically connected to ground. The pole of a single pole, single throw high side stabilizing switch 18 is electrically connected to a node between resistors 17 and 25, and an output terminal of the switch 18 is electrically connected to line 20 and to the output terminal of test control switch 14.

By way of example only, in a test environment where the test fixture capacitance 21 is of the order of 800 pF, the I/O pin capacitance is of the order of 200 pF, and a stabilization time of less than 10 $\mu$seconds is desired, the resistance of resistor 17 would be approximately 180 Ω, and the resistance of resistor 18 would be approximately 390 Ω, as determined from equation (1) above. Resistor 17 and resistor 25 thus are in a resistance ratio of approximately 1:2, and form a voltage divider with a potential at line 26 equal to approximately 2/3 of the potential at the output of buffer amplifier 11.

A low-side stabilizing circuit is comprised of a low side stabilizing resistor 29 having a resistance small compared to that of a selected one of current sensing resistors 12a–12d. In the example given above, resistor 29 has a resistance of approximately 390 Ω in electrical series with a single pole, single throw low side stabilizing switch 28, which is electrically connected between ground and the output terminals of test control switch 14 and high side stabilizing switch 18. More particularly, one terminal of resistor 29 is electrically connected to circuit ground. The other terminal of resistor 29 is electrically connected to the input pole of switch 28. The output pole of switch 28 in turn is electrically connected to the output pole of switch 18, to the output pole of switch 14, and to line 20.

In operation, one of current sensing resistors 12a–12d is electrically connected across the input terminals of amplifier 13 when a corresponding one of range selection switches 27a–27d is closed. The selection of one of resistors 12a–12d is made to allow the measurement of leakage currents between approximately 50 nA (nanoamperes) and 330 $\mu$A (microamperes), with a measurement in any given range yielding voltages across the input terminals of instrumentation amplifier 13 between 0.1 V and 1.0 V. Table I below illustrates the relationship between the current sensing resistor which is selected, and the actual leakage current range within which a measurement will occur. With the current limit $I_{Limit}$ specified by the manufacturer for the IC chip under test, the current range for leakage current measurements may be selected, and the associated current sensing resistance may be identified.

TABLE I

| RESISTOR | RESISTANCE VALUE | CURRENT RANGE | SWITCH CLOSED |
|---|---|---|---|
| 12a | 2.00 MΩ | 50 nA to 500 nA | 27a |
| 12b | 301 kΩ | 330 nA to 3.3 $\mu$A | 27b |
| 12c | 30.1 kΩ | 3.3 $\mu$A to 33 $\mu$A | 27c |
| 12d | 3.01 kΩ | 33 $\mu$A to 330 $\mu$A | 27d |

Assume that a leakage current is to be measured in the range of 50 nA to 500 nA, and that the memory unit under test operates with a positive Vcc supply of 5.0 V.

When a high voltage leakage test is to be performed, the precision D/A voltage source 10 outputs a high-level voltage equivalent to the positive Vcc supply voltage of the I/O pin 22, which for this example is 5.0 V. After buffering by amplifier 11, the high-level voltage appears at a node 19, and is applied to the voltage divider comprising resistors 17 and 25. The voltage at node 19 also is applied to one terminal of each of the current sensing resistors 12a–12d, and to the positive input terminal of instrumentation amplifier 13. Referring to Table I, and by way of example only, for a given leakage current measurement in the range of 50 nA to 500 nA, switch 27a is closed and switches 27b, 27c, and 27d remain open. The test control switch 14 is closed to provide an electrical connection between the selected current sensing resistor and the I/O pin 22 of the IC chip under test. Switch 18 thereafter is closed for approximately 10 $\mu$s to charge the test fixture capacitance 21 and the I/O pin capacitance 23 to the potential of line 26, which is equivalent to 2/3 of 5.0 V or approximately 3.33 V. After switch 18 reopens, a settling time of approximately 2 ms is allowed before measurement commences.

When a low voltage leakage test is to be performed, the precision D/A voltage source 10 outputs a low voltage of 0.0

V. After buffering by amplifier 11, the low voltage appears as a virtual ground at node 19. Referring to Table I, and by way of example only, for a leakage current measurement range of 50 nA to 500 nA, switch 27a is closed and switches 27b, 27c, and 27d remain opened. Switch 14 is closed to provide an electrical connection between the selected current sensing resistor and the I/O pin 22. Switch 28 then is closed for 10 μs to discharge test fixture capacitance 21 and I/O pin capacitance 23 to ground through resistor 29. After switch 28 is reopened, a settling time of approximately 2 ms is allowed before measurement commences.

In the case of either a high voltage or a low voltage leakage test, the voltage developed across a selected one of current sensing resistors 12a–12d appears at the input terminals of amplifier 13, and is transmitted as a ground-referenced voltage to the A/D converter 15 to be digitized. The digitized value thereafter is accessed by the processor 16, where it is normalized to compensate for the leakage current measurement range, and then compared to threshold values to determine whether the I/O pin under test is within tolerances.

Thus, from equation (5) above, overall settling time is reduced from approximately 11 milliseconds using the circuit of FIG. I of the prior art to approximately 2 milliseconds using the method and circuit of FIG. 2, representing in excess of a five-fold improvement in measurement time.

The combination of a precision A/D voltage source 10 with 16 bit resolution, use of current sensing resistors 12a–12d with tolerances of 0.1% each, electronic switches 14 and 27a–27d with 25 Ω "ON" resistance and sub-nanoampere typical leakage current, instrumentation amplifier 13 with 0.01% typical error, and A/D converter 15 with 16 bit resolution provides overall measurement accuracy commensurate with process monitoring requirements of a manufacturing environment. Application of the above components with positive and negative power supplies allows fully bipolar operation with respect to the polarity of voltage sourced and the direction of current measured through adaptation of operational amplifier technology. Further, system use of few components contributes to reliability superior to discrete component designs.

Figure 3:
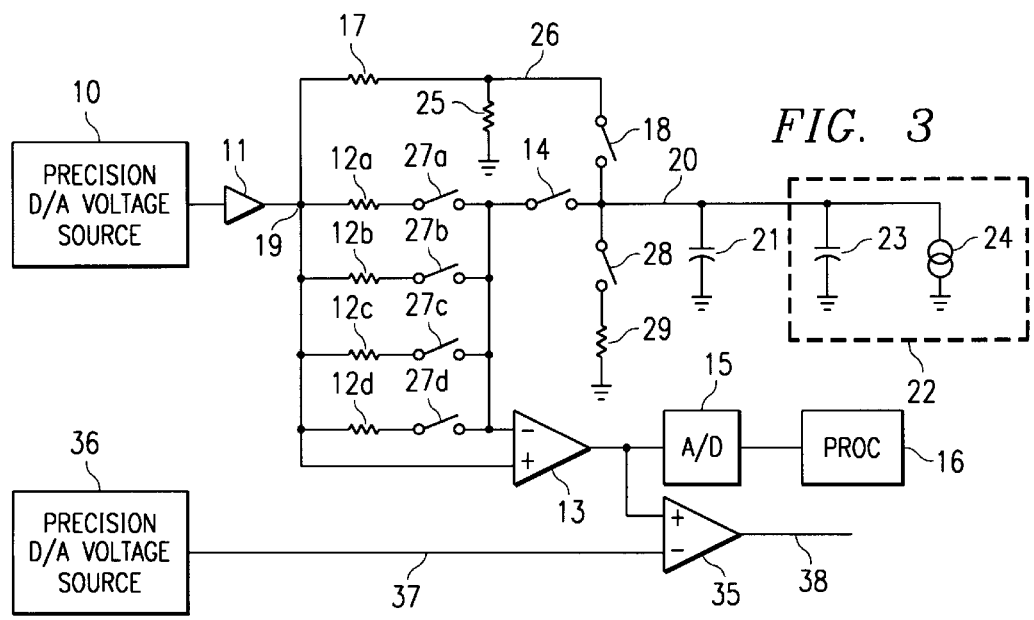
FIG. 3 is an alternative embodiment of the invention for further reducing test time when only compliance with preset tolerances is determined.

Referring to FIG. 3, an alternative embodiment of the invention is illustrated for determining whether a pin under test is within allowable leakage current tolerances. The devices referred to by reference numbers 10, 11, 12a–12d, and 13–29 are as before described. Added to the circuit is a comparator 35 and a second precision D/A voltage source 36. More particularly, the negative input of the comparator 35 is electrically connected to the output of the voltage source 36 by way of a line 37, and the positive input of comparator 35 is electrically connected to the output of the instrumentation amplifier 13. The output of the comparator 35 is applied to an error output line 38.

The leakage current measurement performed by way of A/D converter 15 and processor 16 typically takes from 4 to 20 μseconds, depending upon the A/D converter which is used. Additional processing time is required to read the leakage current value, compare it to a predetermined value, and determine whether the pins(s) under test are within allowable tolerances. With the addition of the comparator 21, the tolerance determination may be reduced to as low as 250 nanoseconds. That is, instead of measuring the analog voltage across one of current sensing resistors 12a–12d with the instrumentation amplifier 13, and then converting the analog voltage to a digital voltage with the A/D converter 15, and thereafter using the processor 16 to compare the output of the converter 15 with a predetermined voltage, the output of the amplifier 13 merely is compared by comparator 21 with the reference voltage at the output of the second precision D/A voltage source 36.

The voltage source 10 is set for the maximum allowable leakage current compatible with the current sensing resistor being used. For example, with current sensing resistor 12a at two megaohms, and the maximum allowable leakage current at 500 nanoamps, the voltage source 10 will be set so that the voltage at the output of amplifier 13 will be 1.0 volts. The voltage source 36 is set in accordance with the following equation:

$$V_{Limit} = I_{Limit} \cdot R_{CS} \quad (7)$$

where $I_{Limit}$ is the current limit for the IC chip under test set by the manufacturer, and $R_{CS}$ is the resistance of the current sensing resistor being used.

Further, for high voltage tests, the voltage source 36 output voltage is positive, and for low voltage tests, the voltage source 36 output is negative. Thus, for high voltage tests the output of comparator 35 is a logic one to denote an out of tolerance condition. For low voltage tests, however, the output of the comparator is a logic zero to denote an out of tolerance condition.

As long as no error signal exists on the error output line 38 of the comparator 35, pin after pin may be tested without incurring the overhead of an A/D conversion with processing to determine leakage current. For each I/O pin in which no error signal occurs, a time savings of the order of 4 to 20 microseconds is achieved by dispensing with both the AMD converter 15 conversion time and the processor 16 calculation time. In a CMOS DRAM typically having 100 I/O pins, the test time savings will be dramatic.

The invention has been described and shown with reference to particular embodiments, but variations within the spirit and scope of the general inventive concept will be apparent to those skilled in the art. Accordingly, it should be clearly understood that the form of the invention as described and depicted in the specification and drawings is illustrative only, and is not intended to limit the scope of the invention. All changes which come within the meaning and range of the equivalence of the claims are therefore intended to be embraced therein.

What is claimed is:

1. A test system for measuring leakage currents in an I/O pin of an IC chip, which comprises:

a first precision voltage source for supplying a precision reference voltage;

a buffer amplifier in electrical communication with said first precision voltage source and receiving said precision reference voltage;

a plurality of current sensing resistors each having a first common terminal electrically connected to an output of said buffer amplifier;

a plurality of single pole, single throw switches each having a first pole terminal in electrical communication with a second terminal of a respective one of said plurality of current sensing resistors;

a test control switch having a second pole terminal in electrical communication with a second common terminal of each of said plurality of switches, and a first output terminal in electrical communication with said I/O pin;

a high side stabilizing circuit having an effective resistance small compared to that of any selected one of said plurality of current sensing resistors, and electrically connected between said output of said buffer amplifier, and said first output terminal of said test control switch to stabilize voltage across said any selected one of said plurality of current sensing resistors during high voltage tests;

a low side stabilizing circuit having a resistance small compared to that of said any selected one of said plurality of current sensing resistors, and electrically connected between said first output terminal and ground to stabilize voltage across said any selected one of said plurality of current sensing resistors during low voltage tests;

an instrumentation amplifier having a negative input electrically connected to said second common terminal, and a positive input electrically connected to said first common terminal, for measuring a leakage voltage across said any selected one of said plurality of current sensing resistors;

an A/D converter having an input electrically connected to an output of said instrumentation amplifier and receiving said leakage voltage measurement from said instrumentation amplifier to provide a digital voltage; and a processor having an input electrically connected to an output of said A/D converter and receiving said digital voltage for comparison with threshold voltages to determine whether said I/O pin is within leakage current tolerances.

2. The system of claim 1, wherein said plurality of single pole, single throw switches are electronic programmable switches.

3. The system of claim 1, wherein said high side stabilizing circuit has an effective resistance small compared to that of said any one of said plurality of current sensing resistors, and is comprised of a first high side stabilizing resistor in electrical series with a second high side stabilizing resistor, and with a series circuit formed by said first high side stabilizing resistor and said second high side stabilizing resistor electrically connected between said output of said buffer amplifier and circuit ground, and with a high side stabilizing switch having a third pole terminal in electrical communication with said first high side stabilizing resistor and said second high side stabilizing resistor and electrically connected to a circuit node between said first high side stabilizing resistor and said second high side stabilizing resistor, and with a second output terminal of said high side stabilizing switch electrically connected to circuit ground.

4. The system of claim 3 wherein said low side stabilizing circuit has a resistance small compared to that of said any selected one of said plurality of current sensing resistors, and is comprised of a low side stabilizing switch having a third output terminal electrically connected to said first output terminal, said second output terminal, and to said I/O pin, and a fourth pole terminal electrically connected to a third terminal of a low side stabilizing resistor, the other terminal of which is electrically connected to ground.

5. The system of claim 1, further including a second precision voltage source, and wherein said AID converter and said processor are replaced by a comparator having a second positive input electrically connected to said output of said instrumentation amplifier, and a second negative input electrically connected to an output of said second precision voltage source, and wherein said second precision voltage source generates a positive voltage for high voltage tests and a negative voltage for low voltage tests, and said comparator issues a logic one output to identify an out-of-tolerance condition during high voltage tests, and a logic zero output to identify an out-of-tolerance condition during low voltage tests.

6. The system of claim 1, wherein said system is bipolar with respect to said first precision voltage source, said second precision voltage source, and said leakage currents.

7. The system of claim 1, wherein said system is comprised of low power consuming components and exhibits an economy of component parts for increased reliability.

8. The system of claim 1, wherein said system provides actual leakage current measurements suitable for manufacturing process monitoring.

* * * * *